United States Patent
Kumagai

(10) Patent No.: US 12,360,488 B2
(45) Date of Patent: Jul. 15, 2025

(54) IMAGE FORMING APPARATUS AND CIRCUIT BOARD FOR IMAGE FORMING APPARATUS

(71) Applicant: CANON KABUSHIKI KAISHA, Tokyo (JP)

(72) Inventor: Shigemi Kumagai, Chiba (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 18/514,973

(22) Filed: Nov. 20, 2023

(65) Prior Publication Data

US 2024/0192630 A1 Jun. 13, 2024

(30) Foreign Application Priority Data

Dec. 7, 2022 (JP) ................. 2022-195439

(51) Int. Cl.
*G03G 15/00* (2006.01)
*G03G 21/16* (2006.01)
*H05K 1/00* (2006.01)
*H05K 1/14* (2006.01)
*H01R 12/75* (2011.01)

(52) U.S. Cl.
CPC ......... *G03G 15/80* (2013.01); *G03G 21/1652* (2013.01); *H05K 1/14* (2013.01); *G03G 2221/166* (2013.01); *H01R 12/75* (2013.01); *H05K 2201/10189* (2013.01)

(58) Field of Classification Search
CPC .............. G03G 15/80; G03G 21/1652; G03G 2221/166; H01R 12/75; H05K 1/14; H05K 1/18; H05K 2201/10189; H05K 2201/10325; H05K 2201/10962; H05K 2221/209

USPC .................................................. 399/88, 90
See application file for complete search history.

(56) References Cited

U.S. PATENT DOCUMENTS

| | | | | |
|---|---|---|---|---|
| 5,561,499 | A * | 10/1996 | Setoriyama | G03G 21/1867 399/90 |
| 11,652,937 | B2 * | 5/2023 | Takahashi | H04N 1/00559 358/474 |
| 2004/0131378 | A1 * | 7/2004 | Hattori | G03G 15/80 399/107 |
| 2020/0052450 | A1 * | 2/2020 | Sugiyama | H01R 12/716 |
| 2020/0283250 | A1 * | 9/2020 | Sako | B65H 5/062 |
| 2020/0285189 | A1 * | 9/2020 | Teramoto | G03G 15/80 |
| 2020/0310327 | A1 * | 10/2020 | Kanno | G03G 21/1619 |
| 2020/0409301 | A1 * | 12/2020 | Kuroki | H01R 13/15 |
| 2021/0165358 | A1 * | 6/2021 | Sekiya | H05K 1/14 |

FOREIGN PATENT DOCUMENTS

JP 2002041186 A 2/2002

* cited by examiner

*Primary Examiner* — Robert B Beatty
(74) *Attorney, Agent, or Firm* — Canon U.S.A., Inc. I.P. Division

(57) ABSTRACT

An image forming apparatus includes a first circuit board, a first cable, and a second cable. The first circuit board includes a first connector and a second connector. The first cable is connected to the first connector. The second cable is connected to the second connector. An insertion direction of the first cable to the first connector is along a first direction. An insertion direction of the second cable to the second connector is along a second direction that intersects with the first direction.

19 Claims, 5 Drawing Sheets

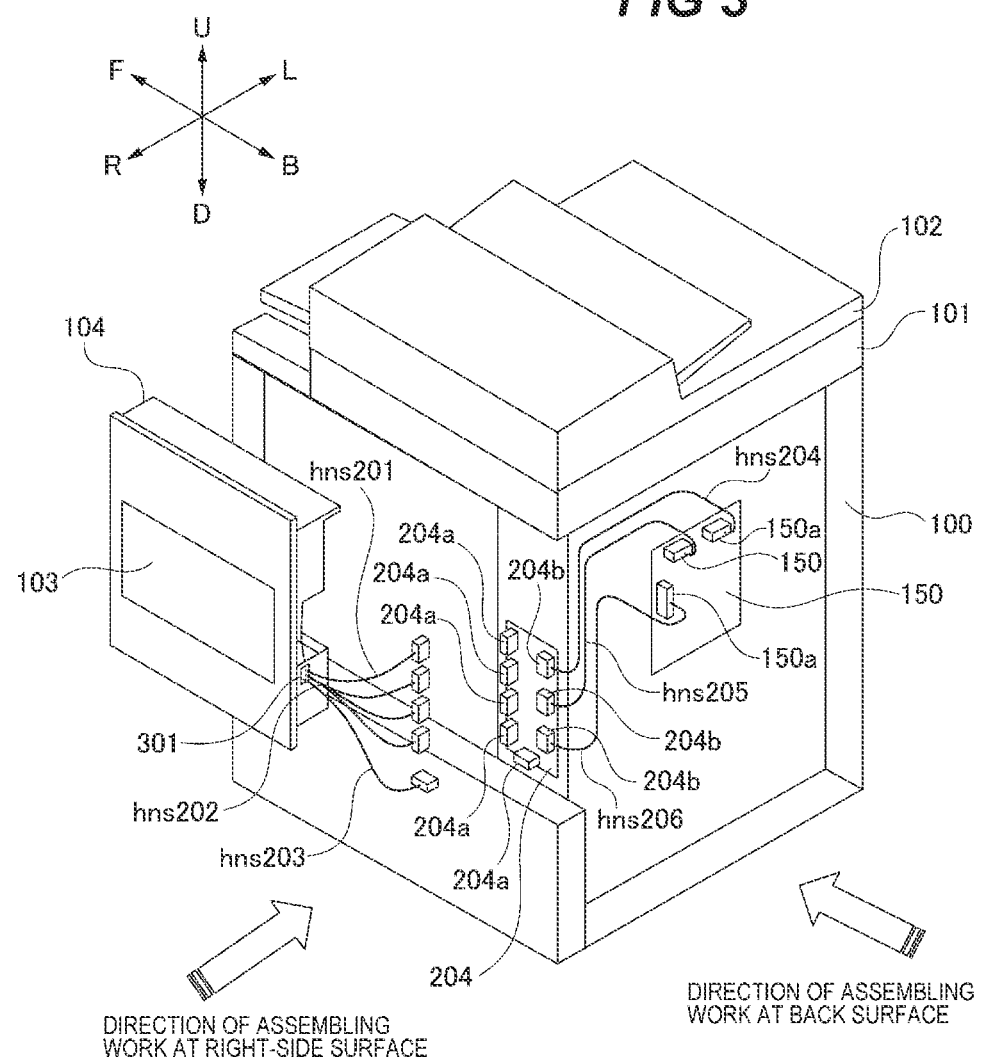

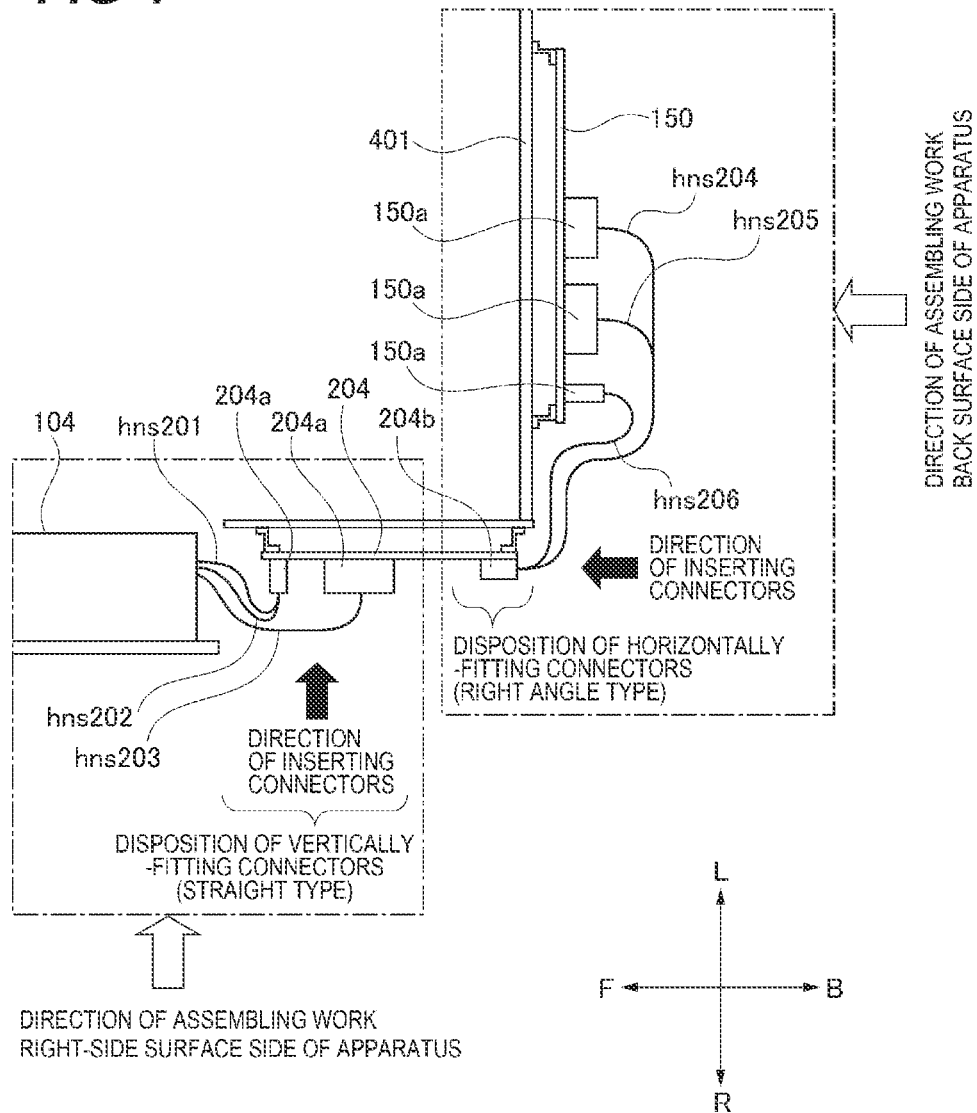

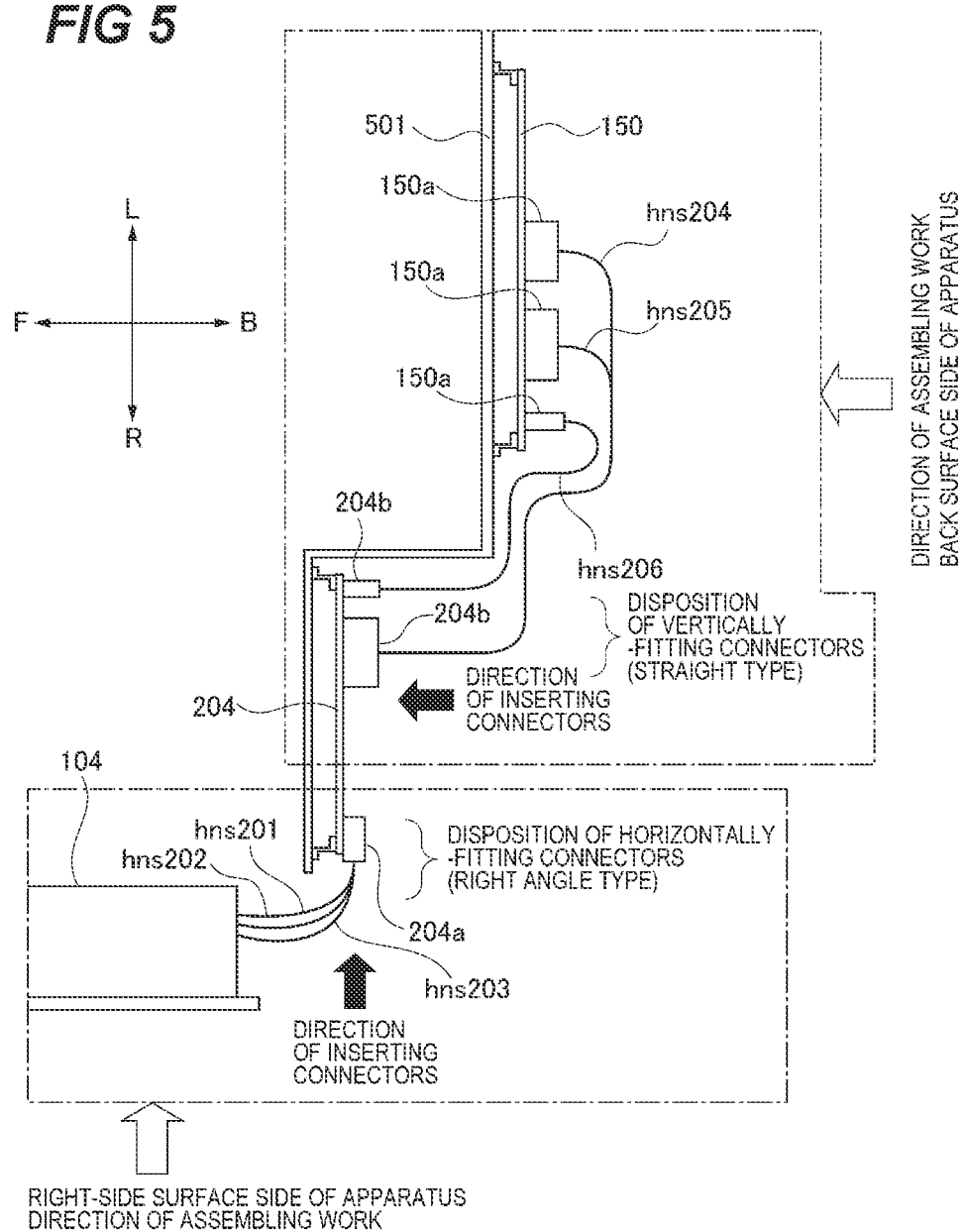

IMAGE FORMING APPARATUS AND CIRCUIT BOARD FOR IMAGE FORMING APPARATUS

BACKGROUND

Field

This disclosure relates to an image forming apparatus of an electrophotographic system, such as a coping machine, a printer, etc., equipped with a circuit board to which a cable for transmitting power and a signal is connected, and a circuit board for the image forming apparatus.

Description of the Related Art

An imaging forming apparatus such as a coping machine and a printer is equipped with load components such as a motor, a subordinate circuit board for driving the load components, and a control circuit board for controlling the load component and the subordinate board. A cable is connected between the control circuit board and the load components or between the control circuit board and the subordinate circuit board. The cable includes bundled wires of power lines for supplying electric power, a ground line (hereinafter referred to as GND line) and a signal line.

When the length of a cable of bundled wires becomes long, or when the number of wires is to be reduced by consolidating the power and GND lines, a relay circuit board may be provided between the control circuit board and load components or between the control circuit board and subordinate circuit board.

The control circuit board is disposed on the back surface of the image forming apparatus, while the load components, the subordinate circuit board, and the relay circuit board may be disposed on a side surface other than the back surface of the image forming apparatus. On the circuit boards mounted are connectors for connecting the cable of bundled wires such as a power line, a signal line.

Japanese Patent Laid-Open Application Publication No. 2002-041186 discloses an information processing apparatus with the configuration in which a connector portion for connecting a cable is rotatably supported by the external wall to selectively direct the connector portion sideward or downward.

By the way, for a connector mounted on a circuit board, a vertically-fitting (straight type) one is widely used although it is called differently depending on manufacturers, such as a pin header and a post header. A vertically-fitting (straight type) connector is connected to a socket on the cable (bundled wires) by approaching the socket to the vertically-fitting connector in the direction perpendicular to the surface of the circuit board.

In the assembly process of the image forming apparatus with this configuration, the cable of bundled wires from the control circuit board disposed on the back surface of the apparatus and the cable of bundled wires from the load component or a subordinate circuit board disposed on the side surface of the apparatus are connected to the connector of the relay circuit board disposed on the side surface of the apparatus.

For example, when all connectors to be mounted on the relay circuit board are the vertically-fitting ones, in connecting each cable of bundled wires from the load components or the subordinate circuit board disposed on the side surface of the apparatus, it is sufficient for each cable to approach each corresponding connector from the side surface side of the apparatus and to be inserted to each corresponding connector on the relay circuit board straight in the direction perpendicular to the surface of the relay circuit board.

On the other hand, in connecting the relay circuit board disposed on the side surface of the apparatus to the control circuit board disposed on the back surface of the apparatus, it is sufficient for each cable to approach each corresponding connector from the back surface side of the apparatus and to be inserted to each corresponding connector on the control circuit board straight in the direction perpendicular to the surface of the control circuit board. In this case, when the cable approaches the connector on the relay circuit board from the back surface side of the apparatus, workability and visibility may deteriorate, resulting in faulty assembly. To insert the cable vertically straight into the connector on the relay circuit board, it is necessary for a worker to go around from the back surface side of the apparatus to the side surface side of the apparatus and for the cable to approach the connector on the relay circuit board from the side surface side of the apparatus, which reduces workability.

SUMMARY

According to an aspect of the present disclosure, an image forming apparatus includes a first circuit board having a first connector and a second connector, a first cable connected to the first connector, and a second cable connected to the second connector, wherein an insertion direction of the first cable to the first connector is along a first direction, and wherein an insertion direction of the second cable to the second connector is along a second direction that intersects with the first direction.

Further features of the present disclosure will become apparent from the following description of exemplary embodiments with reference to the attached drawings.

BRIEF DESCRIPTION OF THE DRAWINGS

FIG. 3 is a diagram showing a perspective view of the image forming apparatus according to the first embodiment of the present disclosure as seen from the right oblique back side.

FIG. 4 is a diagram showing the configuration and arrangement of circuit boards and cables of bundles wires in the image forming apparatus according to the first embodiment of the present disclosure.

FIG. 5 is a diagram showing the configuration and arrangement of circuit boards and cables of bundles wires in the image forming apparatus according to the second embodiment of the present disclosure.

DESCRIPTION OF THE EMBODIMENTS

Hereinafter, with reference to the drawings, preferable embodiments of the present disclosure will be described in detail. However, the dimensions, materials, shapes, and relative arrangement of the components described in the following embodiments should be changed or modified as appropriate, and it is not intended to limit the scope of the disclosure to them alone.

Embodiment 1

Image Forming Apparatus

Figure 1:
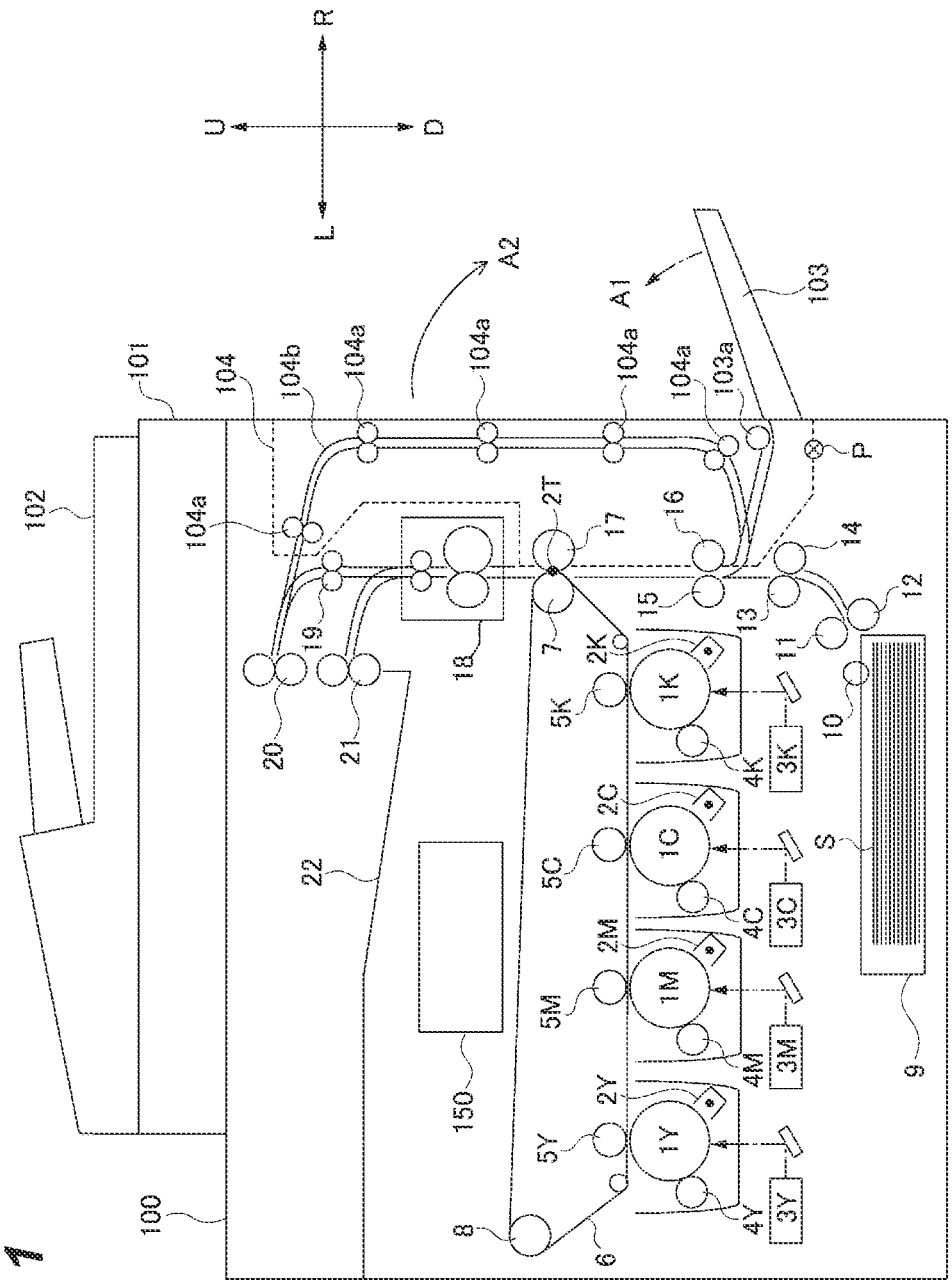
FIG. 1 is a schematic diagram showing the configuration of an image forming apparatus.

First, the configuration of the image forming apparatus of Embodiment 1 of the present disclosure will be described referring to FIG. 1. FIG. 1 is a schematic diagram showing a sectional view of the image forming apparatus according to Embodiment 1 of the present disclosure.

The image forming apparatus 100 forms an image and outputs it onto the recording material S in response to image data received from outside via a network. The image forming apparatus 100 includes the document reading portion 101, the automatic document feeder (hereinafter referred to as ADF) 102, the manual feed portion (multi feed portion) 103, and the right door unit 104.

The document reading portion 101 optically reads a sheet-like document using an unshown sensor (CIS or CCD), converts it into an image signal, and sends the image signal to the control circuit board 150. The ADF 102 feeds multiple sheets of documents continuously to the document reading portion 101. The manual feed portion (multi feed portion) 103 manually feeds the recording materials S infrequently used such as postcards, envelopes, and colored paper, and can be folded in the direction of arrow A1 when not in use.

The right door unit 104 is coupled to the lower side of the main body of the image forming apparatus 100 by a hinge, and can be opened in the direction of arrow A2 with the P point as the axis during jam recovery and maintenance. The right door unit 104 also functions as a conveying unit for conveying the recording material S, which is switched back by the conveying roller 19 and the reversing roller 20, to the registration roller pair 15-16 during duplex printing, which forms images on the front and back (both sides) of the recording material S. The right door unit 104 includes duplex conveying rollers 104a that convey switch-backed recorded material S to the registration roller pair 15-16, and the duplex conveying path 104b that guides the recording material S. The right door unit 104 also includes the manual feed roller 103a that feeds the recording material S at the manual feed portion 103. The right door unit 104 also includes the registration roller 16 that is one of the registration roller pair, and the secondary transfer outer roller 17. When the right door unit 104 is opened in the direction of arrow A2, the secondary transfer outer roller 17 is separated from the secondary transfer inner roller 7 and the registration roller 16 is separated from the registration roller 15.

Next, the image forming operation of the image forming apparatus 100 will be described.

First, toner images are formed on the photosensitive drums 1Y, 1M, 1C and 1K based on image data. Toner images are formed separately for the colors yellow (Y), magenta (M), cyan (C), and black (K), but the method of forming each color toner image is substantially identical to each other except for the color differences. Therefore, only the formation for the yellow (Y) toner image will be described below. For the image formation for the magenta (M), cyan (C), and black (K) toner, a mere replacement of the letter Y of the symbol used for the components in the description with M, C or K will be sufficient and duplicate descriptions will be omitted.

The formation of yellow (Y) toner image is performed by the photosensitive drum 1Y, the charging device 2Y, the laser scanner 3Y, the developing device 4Y, and the primary transfer roller 5Y.

First, the drum surface of the rotating photosensitive drum 1Y is uniformly charged by the charging device 2Y. The image signal generated based on the image data is then input to the laser scanner 3Y. The laser scanner 3Y includes a semiconductor laser device and a polygon mirror, and outputs a laser beam modulated by the input image signal from the semiconductor laser device. The surface of the photosensitive drum 1Y is irradiated with the laser beam output from the semiconductor laser device via the polygon mirror and mirrors so that the photosensitive drum 1Y is exposed. The photosensitive drum 1Y, whose surface is uniformly charged by the charging device 2Y, is exposed to laser light to form an electrostatic latent image on the photosensitive drum 1Y. The electrostatic latent image formed on the photosensitive drum 1Y is developed by the toner supplied from the developing device 4Y to form a yellow toner image on the photosensitive drum 1Y. The toner image on the photosensitive drum 1Y moves with the rotation of the photosensitive drum 1Y to the primary transfer position facing the primary transfer roller 5Y. A primary transfer bias of the opposite polarity to the charging polarity of the toner is applied to the primary transfer roller 5Y by a bias voltage supplying portion (not shown). With this primary transfer bias, the toner image formed on the photosensitive drum 1Y is transferred onto the intermediate transfer belt 6.

The same toner image formation as that for yellow (Y) toner is also performed for magenta (M), cyan (C), and black (K) toners. The toner images of each color are then transferred on the intermediate transfer belt 6 in a sequentially superimposed manner to form a full-color toner image. The full-color toner image is moved to the secondary transfer inner roller 7 by the intermediate transfer belt 6.

Meanwhile, the recording material S accommodated in the cassette 9 is fed onto the recording material conveying path by the feed roller 10 and is conveyed by the conveying roller pair 11-12 and the conveying roller pair 13-14 toward the registration roller pair 15-16. The recording material S is conveyed to the secondary transfer position 2T by the registration roller pair 15-16 in accordance with the timing of the toner image that moves with the conveyance of the intermediate transfer belt 6.

At the secondary transfer position 2T, a bias voltage is applied to the secondary transfer outer roller 17, and the toner image on the intermediate transfer belt 6 is transferred from the intermediate transfer belt 6 to the recording material S by the bias voltage. The recording material S onto which the toner image has been transferred is conveyed to the fixing device 18. The toner image transferred to the recording material S is fixed to the recording material S by heat and pressure at the fixing device 18.

The recording material S that has passed through the fixing unit 18 is discharged onto the in-body discharge tray 22 by the discharge roller 21 in the case of a single-side printing. In the case of duplex printing, after fixing the toner image on the front side of the recording material S, the recording material S is discharged halfway to the in-body discharge tray 22 by the conveying roller 19 and the reversing roller 20, and the conveyance of the recording material S is temporarily stopped with the rear edge of the recording material S being borne by the reversing roller 20. Then, the reversing roller 20 is rotated in the reverse direction to convey the borne recording material S to the duplex conveying path 104b, and the recording material S is conveyed to the registration roller pair 15-16 by the multiple duplex conveying rollers 104a. The recording material S is then discharged onto the in-body discharge tray 22 by the discharge roller 21 after the image formation on the back side of the recording material S is performed. In this way, the image formation is performed on the recording material S.

The image forming apparatus 100 shown in FIG. 1 is viewed from the front side. This is defined as the front side of the image forming apparatus 100. On the other hand, when the front side of the image forming apparatus 100 shown in FIG. 1 is used as a reference, the side opposite the front side of the image forming apparatus 100 is defined as the back side of the image forming apparatus 100. In the image forming apparatus 100 shown in FIG. 1, the left side is defined as the side on which the photosensitive drum 1Y on which the electrostatic latent image for the yellow toner image is to be formed is located with respect to the photosensitive drum 1K on which the electrostatic latent image for the black toner image is to be formed. The right side is defined as the side on which the photosensitive drum 1K on which the electrostatic latent image for the black toner image is to be formed is located with respect to the photosensitive drum 1Y on which the electrostatic latent image for the yellow toner image is to be formed. The upward direction is defined as a vertical upward direction perpendicular to the front-back direction and the right-left direction defined above. The downward direction is defined as a vertical downward direction perpendicular to the front-back direction and the right-left direction defined above. The forward direction F, the backward direction B, the rightward direction R, the leftward direction L, the upward direction U and the downward direction D are shown in FIGS. 1, 3 and so on.

Configuration of Components/Connection of Image Forming Apparatus

Figure 2:
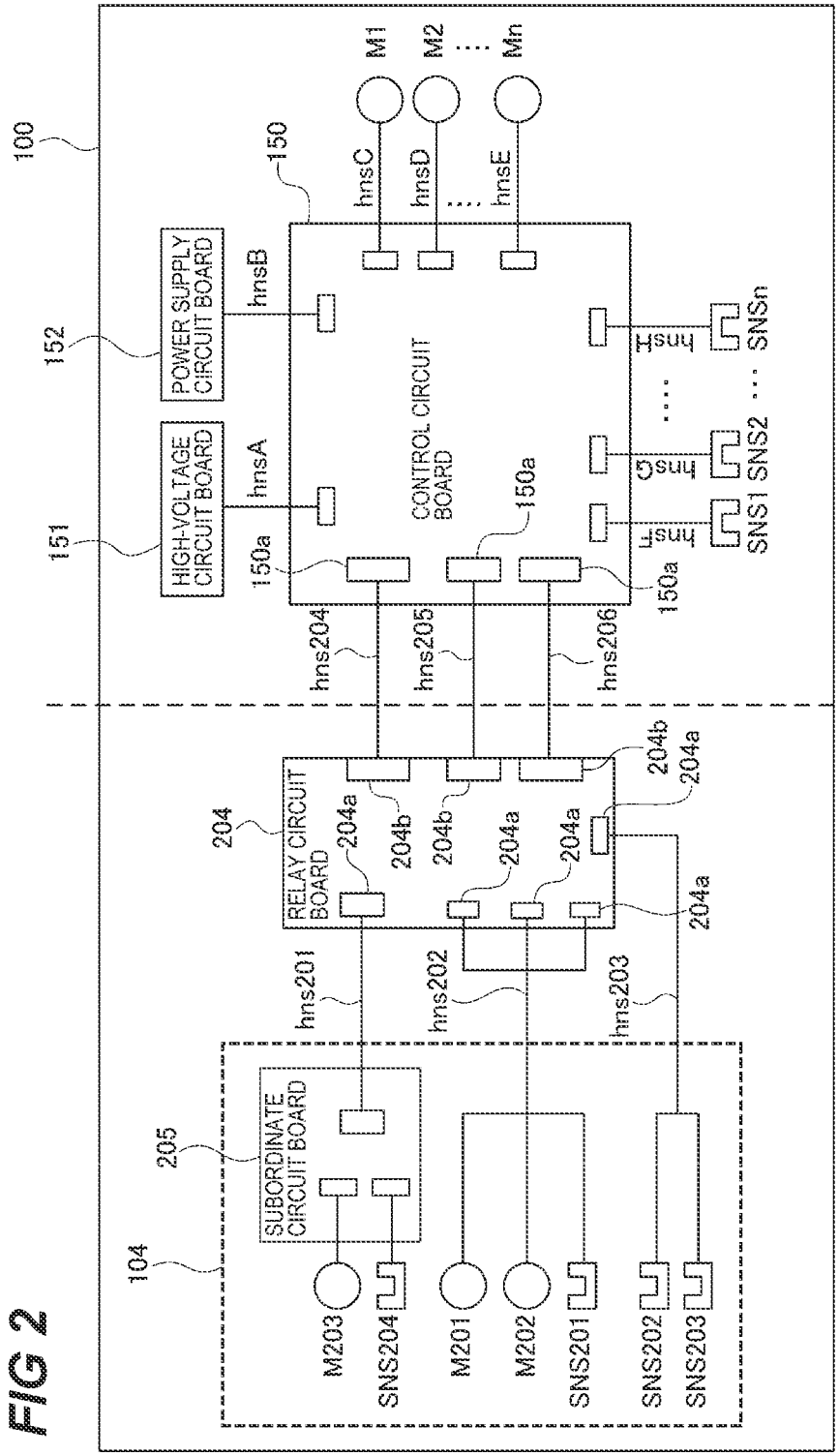
FIG. 2 is a block diagram showing an example of the connection configuration of circuit boards, load components, and cables of bundled wires in an image forming apparatus.

Next, the configuration of the components/connection of the image forming apparatus will be described. FIG. 2 is a block diagram showing an example of the configuration of the connection of the circuit boards, the load components, and the cable of bundled wires of the image forming apparatus 100. FIG. 3 is a diagram showing a perspective view of the image forming apparatus 100 as seen from the right oblique back side.

The image forming apparatus 100 has the control circuit board 150, the relay circuit board 204, and the right door unit 104 that includes built-in load components such as a motor.

The control circuit board 150 controls the image forming apparatus 100 to perform the series of image forming operations described above. The control circuit board 150 is connected to the high voltage circuit board 151 by the cable of bundled wires hnsA. The high voltage circuit board 151 supplies a high voltage to the photosensitive drums 1Y to 1K, the charging devices 2Y to 2K, the developing devices 4Y to 4K and so on. The control circuit board 150 is connected to the power supply circuit board 152, which supplies a power supply voltage necessary for the operation by the cable of bundled wires hnsB. The control circuit board 150 is connected by the cables of bundled wires hnsC to hnsE to the multiple motors M1 to Mn, respectively. The multiple motors M1 to Mn are provided for rotating the photosensitive drums 1Y to 1K, the developers 4Y to 4K, the intermediate transfer belt 6 and so on. The control circuit board 150 is connected by the cables of the bundled wires hnsF to hnsH respectively to the multiple sensors SNS1 to SNSn for detecting the timing of the passage of the recording material S and so on.

The multiple connectors 150a for connecting the first cables of bundled wires hns204 to hns205 respectively are mounted on the control circuit board 150. The control circuit board 150 is mounted on the back side of the image forming apparatus 100 as shown in FIG. 3.

The relay circuit board 204 is mounted on the image forming apparatus 100 in the direction perpendicular to the surface of the control circuit board 150. Specifically, the relay circuit board 204 is mounted on the right-side surface side of the image forming apparatus in the direction perpendicular to the surface of the control circuit board 150 mounted on the back surface side of the image forming apparatus 100 as shown in FIG. 3. Namely, the plane (first plane) including the surface of the control circuit board 150 and the plane (second plane) including the surface of the relay circuit board 204 intersect with each other perpendicularly.

The first connectors 204b and the second connectors 204a are mounted on the relay circuit board 204. The first connectors 204b are for connecting the first cables of the bundled wires hns204 to hns206, which are connected to the connectors 150a on the control circuit board 150. The second connectors 204a are for connecting the second cables of bundled wires hns201 to hns203, which are different from the first cables described above.

As shown in FIG. 3, the first connectors 204b are mounted such that the connection ports for connecting the cable of bundled wires hns204 to hns206 are in the same direction as those of the connectors 150a mounted on the control circuit board 150. Namely, the first connectors 204b are mounted such that the connection ports for connecting the cables of bundled wires hns204 to hns206 are in the direction horizontal to the surface of the relay circuit board 204.

On the other hand, the second connectors 204a are mounted such that the connection ports for connecting the cable of bundled wires hns201 to hns203 are in the different direction as those of the first connectors 204b. Namely, the second connectors 204a are mounted such that the connection ports for connecting the cables of bundled wires hns201 to hns203 are in the direction perpendicular to the surface of the relay circuit board 204.

As the first connectors 204b on the relay circuit board 204, so-called horizontally-fitting type connectors (right angle type) are used, of which connection ports face toward the back surface side of the image forming apparatus. As the second connectors 204a on the relay circuit board 204, so-called vertically-fitting type connectors (straight type) are used, of which connection ports face toward the right-side surface side of the image forming apparatus.

The vertically-fitting connector (straight type) has such a shape that the socket on the cable of bundled wires side approaches and fits the connector vertically with respect to the surface of the circuit board. On the other hand, the horizontally-fitting connector (right angle type) has such a shape that the socket on the cable of bundled wires side approaches and fits the connector horizontally with respect to the surface of the circuit board.

The relay circuit board 204 is disposed between the control circuit board 150 and the right door unit 104, in which load components are provided, and connects the control circuit board 150 and the load components provided in the right door unit 104.

In the right door unit 104, a driving source, a detecting portion, and a subordinate ordinate circuit board as load components are provided, which will be described below.

Namely, the motors M201 and M202 are provided in the right door unit 104. The motors M201 and M202 are drive sources for rotating the duplex conveying rollers 104a. The duplex conveying rollers 104a are rotating bodies that convey the sheet-like recording material S, which is a sheet. The sensors SNS201 to SNS203 are provided in the right door unit 104. The sensors SNS201 to SNS203 are detecting portions for detecting the timing of the recording material S passing through the duplex conveying path 104b.

The motor M203 and the subordinate circuit board 205 for driving the motor M203 are provided in the right door unit 104. The motor M203 is a driving source for rotating the manual feed roller 103a. The manual feed roller 103a is a rotating body that feeds the recorded material S from the manual feed portion 103. The subordinate circuit board 205 connects the motor M203 and the relay circuit board 204 described above. The sensor SNS 204 is provided in the right door unit 104. The sensor SNS 204 detects that a recording material S is placed in the manual feed portion 103. The motor M203 and the sensor SNS204 are connected to the subordinate circuit board 205 by a cable of bundled wires.

The right door unit 104 has the second cables of bundled wires hns201 to hns203. The second cables of bundled wires hns201 to hns203 are connected to the second connectors mounted on the relay circuit board 204. The cable of bundled wires hns201 is connected to the subordinate board 205 as the load components. The cable of bundled wires hns202 is connected to the motors M201, M202 and the sensor SNS201. The cable of bundled wires hns203 is connected to sensors SNS202 and SNS 203. The cables of bundled wires hns201 to hns203 then exit to the outside of the right door unit 104 from the bundle-wire-passing-through opening 301 at the lower portion at the back side of the right door unit 104 as shown in FIG. 3.

The right door unit 104 is disposed in the image forming apparatus 100 in the direction perpendicular to the surface of the control circuit board 150 as shown in FIG. 3. Specifically, the right door unit 104 is mounted on the right-side surface side of the image forming apparatus 100 in the direction perpendicular to the surface of the control circuit board 150 mounted on the back surface side of the image forming apparatus 100.

FIG. 4 is a diagram showing the configuration and arrangement of the circuit boards and the cables of bundled wires in the image forming apparatus according to Embodiment 1. In detail, FIG. 4 is a diagram showing a top view viewed from the top surface side of the apparatus. FIG. 4 shows the configuration and arrangement of the relay circuit board 204, the right door unit 104, the cables of bundled wires hns201 to hns203, the control circuit board 150 and the cables of bundled wires hns204 to hns206 connecting the relay circuit board 204 and the control circuit board 150. The cable of the bundled wires hns204 includes a power line to supply power and a ground line (GND line) to ground.

The high voltage circuit board 151, the power supply circuit board 152, the motors M1 to Mn, the sensors SNS1 to SNSn, and the cables of bundled wires hnsA to hnsH shown in FIG. 2 are not directly connected to the relay circuit board 204 and are omitted here.

The right side in FIG. 4 corresponds to the back surface side of the image forming apparatus 100, and the lower side corresponds to the right-side surface side of the image forming apparatus 100. The frame 401, which constitutes the housing of the image forming apparatus 100, is a part of the image forming apparatus 100 and is generally formed of a sheet metal material. The frame 401 according to this embodiment is a sheet metal with an end bent into an L-shape. The circuit boards, the motors and various units are mounted on the frame 401 of the image forming apparatus 100. In this embodiment, the control circuit board 150 is mounted on the back surface side of the frame 401, and the relay circuit board 204 is mounted on the right-side surface side of the frame 401 in the direction perpendicular to the back surface of the frame 401. Namely, the relay circuit board 204 is mounted in the direction perpendicular to the surface of the control circuit board 150 and is located so as to saddle with the two side surfaces of the frame.

The mounting work of the right door unit 104 to the frame 401 is performed from the lower side of FIG. 4, i.e., from the right-side surface side of the image forming apparatus 100. Therefore, the work of fitting the cables of bundled wires hns201 to hns203 sticking out of the right door unit 104 to the respective connectors 204a on the relay circuit board 204 is also performed from the right-side surface side of the image forming apparatus 100, which is in the same direction as that of mounting the right door unit 104 to the frame 401. In this embodiment, the connectors 204a on the relay circuit board 204 adopt vertically-fitting connectors (straight type) in accordance with the assembly work direction. As a result, an assembly worker can insert the socket on the cables of bundled wires into the connectors 204a of vertically-fitting type on the relay circuit board 204 without changing the direction.

On the other hand, the mounting work of the control circuit board 150 to the frame 401 is performed from the right side of FIG. 4, i.e., from the back surface side of the image forming apparatus 100. Therefore, the work of fitting the cables of bundled wires hns204 to hns206 to the respective connectors on the control circuit board 150 and the relay circuit board 204 are also performed from the back surface side of the image forming apparatus 100, which is in the same direction as that of mounting the control circuit board 150 to the frame 401. In this embodiment, the connectors 150a on the control circuit board 150 adopt vertically-fitting connectors (straight type), while the connectors 204b on the relay circuit board 204 adopt horizontally-fitting connectors (right angle type). Namely, the first connectors 204b on the relay circuit board 204 adopt the connectors whose connection ports for connecting the cable of bundled wires hns204 to hns206 are in the same direction as those of the connectors 150a mounted on the control circuit board 150. As a result, an assembly worker can insert the socket on the cables of bundled wires into the connectors 150a of vertically-fitting type on the control circuit board 150 and the connectors 204b of horizontally-fitting type on the relay circuit board 204 without changing the direction.

As described above, in this embodiment, the different fitting directions of the connection ports of the connectors of the relay circuit board 204 are used according to the direction of the assembly work. This improves workability and visibility when inserting cables into connectors mounted on the circuit board, and prevents assembly defects such as half-insertion or slanted insertion of the connectors. Further, an assembly worker can insert the sockets of the cables of bundled wires into the connectors on the relay board without changing the direction, which also reduces the burden on the assembly worker.

Embodiment 2

Next, the configuration of the image forming apparatus of Embodiment 2 of the present disclosure will be described referring to FIG. 5. FIG. 5 is a diagram showing the configuration and arrangement of the circuit boards and the cables of bundled wires in the image forming apparatus according to Embodiment 2.

In the present embodiment, the relay circuit board 204 is mounted on the image forming apparatus 100 in the direction horizontal to the surface of the control circuit board 150. Namely, the relay circuit board 204 is disposed such that the surface of the relay circuit board 204 and the surface of the control circuit board 150 are in the same direction.

In the present embodiment, the control circuit board 150 and the relay circuit board 204 are mounted in the same direction on the frame 501, which is integrally formed as a whole. However, the frame may be divided into separate parts, and the control circuit board 150 and the relay circuit board 204 may be mounted on the separate parts of the frame 501.

As shown in FIG. 5, the relay circuit board in this embodiment has the opposite relationship with the relay circuit board in Embodiment 1 in terms of the directions of the connection ports of the connectors mounted on the relay circuit board.

The first connectors 204b are mounted such that the connection ports of the first connectors 204b, which connect the first cables of bundled wires hns204 to hns206, are in the same direction as those of the connection ports of the connectors mounted on the control circuit board 150. Namely, the first connectors 204b are mounted in the direction perpendicular to the surface of the relay circuit board 204.

The second connectors 204a are mounted such that the connection ports of the second connectors 204a, which connect the second cables of bundled wires hns201 to hns203, are in the different direction as those of the connection ports of the connectors mounted on the control circuit board 150. Namely, the second connectors 204a are mounted in the direction horizontal to the surface of the relay circuit board 204.

The second connectors 204a into which the second cables of bundled wires hns201 to hns203 from the right door unit 104 are inserted adopt horizontally-fitting connectors (right angle type). On the other hand, the first connectors 204b into which the first cables of bundled wires hns204 to hns206 from the control circuit board 150 are inserted adopt vertically-fitting connectors (straight type).

As described above, in this embodiment, in which the relay circuit board 204 is mounted such that the surface of the control circuit board 105 and the surface of the relay circuit board 204 are in the same direction, the different fitting directions of the connection ports of the connectors of the relay circuit board 204 are used according to the direction of the assembly work. This improves workability and visibility when inserting cables into connectors mounted on the circuit board, and prevents assembly defects such as half-insertion or slanted insertion of the connectors. Further, an assembly worker can insert the sockets of the cables of bundled wires into the connectors on the relay board without changing the direction, which also reduces the burden on the assembly worker.

Other Modifications

Although a unit with built-in load components is exemplified in the above-described embodiments, the present disclosure is not limited to this configuration. The configuration can be adopted in which the load components are directly placed in the image forming apparatus as stand-alone units. As a unit with built-in load components, the conveying unit (right door unit) with rotating members such as registration rollers and a secondary transfer outer roller that convey a sheet is shown as an example, but the present disclosure is not limited to this configuration and may be a unit with other load components. The load components are not limited to a drive source that drives a rotating member. However, they can also be a detecting portion, such as a sensor that detects a sheet, for example. The same effect can be obtained by applying the present disclosure to an image forming apparatus with these load components or a unit with these built-in load components.

In the above-described embodiments, a copying machine equipped with an ADF 102 that feeds a document to be read and a document reading portion (image reading apparatus) 101 that reads the image of the document is exemplified as an image forming apparatus. However, the present disclosure is not limited to this configuration. For example, the present disclosure can be applied to an image forming apparatus such as a printer that is not equipped with an image reading apparatus, or an image forming apparatus such as a multifunctional machine that combines these functions.

In the above-described embodiments, an image forming apparatus with the configuration using the intermediate transfer tandem system in which four image forming portions that form toner images of yellow, magenta, cyan, and black colors are arranged side by side on an intermediate transfer member is exemplified. However, the present disclosure is not limited to this configuration. The image forming apparatus according to the present disclosure is not limited to a color image forming apparatus with multiple photosensitive drums as shown in FIG. 1. The image forming apparatus according to the present disclosure can be, for example, a color image forming apparatus with one photosensitive drum or an image forming apparatus that forms black and white images.

In the above-described embodiments, an image forming apparatus is exemplified that uses an intermediate transfer member, transfers toner images of each color in a sequentially superimposed manner on the intermediate transfer member, and transfers the toner images borne on the intermediate transfer member to the recording material at a time. However, the present disclosure is not limited to this configuration. The image forming apparatus according to the present disclosure can be an image forming apparatus that uses a recording material bearing member and transfers toner images of each color in a sequentially superimposed manner on the recording material borne on the recording material bearing member.

In the above-described embodiments, an image forming apparatus using electrophotographic system as a recording system is exemplified. However, the present disclosure is not limited to this configuration. The image forming apparatus according to the present disclosure can be an image forming apparatus that uses other recording systems, such as inkjet printing.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2022-195439, filed Dec. 7, 2022, which is hereby incorporated by reference herein in its entirety.

What is claimed is:

1. An image forming apparatus comprising:
   a first circuit board having a first connector and a second connector;
   a first cable connected to the first connector;
   a second cable connected to the second connector; and
   a control circuit board having a third connector to which the first cable is connected,
   wherein an insertion direction of the first cable to the first connector is along a first direction, wherein an insertion direction of the second cable to the second connector is along a second direction that intersects with the first direction,
wherein the control circuit board is configured to control the image forming apparatus, and an insertion direction of the first cable to the third connector is along the first direction, and
wherein the control circuit board is mounted on a back surface of the image forming apparatus, and the first circuit board is mounted on a side surface of the image forming apparatus.

2. The image forming apparatus according to claim 1, wherein a plane including a surface of the control circuit board intersects at a right angle with a plane including a surface of the first circuit board.

3. The image forming apparatus according to claim 1, wherein a plane including a surface of the control circuit board is parallel to a plane including a surface of the first circuit board.

4. The image forming apparatus according to claim 1, wherein the control circuit board and the first circuit board are mounted on a back surface of the image forming apparatus.

5. The image forming apparatus according to claim 1, further comprising a load component,
wherein the first cable connects the first circuit board with the control circuit board, and the second cable connects the first circuit board with the load component.

6. The image forming apparatus according to claim 5, wherein the control circuit board is mounted on a back surface of the image forming apparatus, and the first circuit board and the load component are mounted on a side surface of the image forming apparatus.

7. The image forming apparatus according to claim 5, wherein the first circuit board and the control circuit board are mounted on a back surface of the image forming apparatus, and the load component is mounted on a side surface of the image forming apparatus.

8. The image forming apparatus according to claim 5, wherein the first circuit board is disposed between the control circuit board and the load component and relays a connection between the control circuit board and the load component.

9. The image forming apparatus according to claim 5, wherein the load component includes a driving source configured to drive a rotating member configured to convey a sheet.

10. The image forming apparatus according to claim 5, wherein the load component includes a detecting portion configured to detect a sheet.

11. The image forming apparatus according to claim 5, wherein the load component includes a subordinate circuit which connects the control circuit board with a driving source configured to drive a rotating member configured to convey a sheet or a detecting portion configured to detect a sheet.

12. The image forming apparatus according to claim 1, wherein the first direction is a front-back direction of the image forming apparatus, and
wherein the second direction is a left-right direction of the image forming apparatus.

13. An image forming apparatus comprising:
a first circuit board having a first connector and a second connector;
a first cable connected to the first connector;
a second cable connected to the second connector; and
a control circuit board having a third connector to which the first cable is connected, and
a load component,
wherein an insertion direction of the first cable to the first connector is along a first direction,
wherein an insertion direction of the second cable to the second connector is along a second direction that intersects with the first direction,
wherein the control circuit board is configured to control the image forming apparatus, and an insertion direction of the first cable to the third connector is along the first direction, and
wherein the first cable connects the first circuit board with the control circuit board, and the second cable connects the first circuit board with the load component.

14. The circuit board according to claim 13, wherein the control circuit board is mounted on a back surface of the image forming apparatus, and the first circuit board and the load component are mounted on a side surface of the image forming apparatus.

15. The image forming apparatus according to claim 13, wherein the first circuit board and the control circuit board are mounted on a back surface of the image forming apparatus, and the load component is mounted on a side surface of the image forming apparatus.

16. The image forming apparatus according to claim 13, wherein the first circuit board is disposed between the control circuit board and the load component and relays a connection between the control circuit board and the load component.

17. The image forming apparatus according to claim 13, wherein the load component includes a driving source configured to drive a rotating member configured to convey a sheet.

18. The image forming apparatus according to claim 13, wherein the load component includes a detecting portion configured to detect a sheet.

19. The image forming apparatus according to claim 13, wherein the load component includes a subordinate circuit which connects the control circuit board with a driving source configured to drive a rotating member configured to convey a sheet or a detecting portion configured to detect a sheet.

* * * * *